US011184997B2

(12) United States Patent
Broderick et al.

(10) Patent No.: US 11,184,997 B2
(45) Date of Patent: Nov. 23, 2021

(54) SYSTEM TO REDUCE COOLANT USE IN AN ARRAY OF CIRCUIT BOARDS

(71) Applicant: Intel Corporation, Santa Clara, CA (US)

(72) Inventors: Joseph Andrew Broderick, Beaverton, OR (US); Barrett M. Faneuf, Beaverton, OR (US); Eric D. McAfee, Portland, OR (US); Juan G. Cevallos, Portland, OR (US); Jaime A. Sanchez, Beaverton, OR (US); Emery E. Frey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 700 days.

(21) Appl. No.: 15/960,127

(22) Filed: Apr. 23, 2018

(65) Prior Publication Data

US 2019/0045661 A1 Feb. 7, 2019

(51) Int. Cl.
*H05K 7/20* (2006.01)
*H05K 7/14* (2006.01)
*H05K 1/02* (2006.01)
*H05K 7/02* (2006.01)

(52) U.S. Cl.
CPC ....... *H05K 7/20236* (2013.01); *H05K 1/0201* (2013.01); *H05K 7/023* (2013.01); *H05K 7/1427* (2013.01); *H05K 7/20272* (2013.01); *H05K 7/20336* (2013.01); *H05K 7/20772* (2013.01); *H05K 7/20781* (2013.01); *H05K 7/20809* (2013.01); *H05K 2201/064* (2013.01); *H05K 2201/066* (2013.01)

(58) Field of Classification Search
CPC .......... H05K 7/20218–20236; H05K 7/20772; H05K 1/0203; H05K 7/20627–20654; H05K 7/20763–2079
USPC .......... 361/818, 699; 165/80.4–80.5, 104.33; 257/714
See application file for complete search history.

(56) References Cited

U.S. PATENT DOCUMENTS

| | | | | |
|---|---|---|---|---|
| 7,889,503 | B2* | 2/2011 | Nagareda | H05K 9/0022 361/719 |
| 8,830,672 | B2* | 9/2014 | Alshinnawi | H05K 7/20772 361/679.47 |
| 9,408,329 | B2* | 8/2016 | Iyengar | H05K 7/20727 |
| 2013/0286580 | A1* | 10/2013 | Ma | F28F 23/00 361/679.47 |
| 2020/0340754 | A1* | 10/2020 | Hanafusa | F28D 15/0266 |

* cited by examiner

*Primary Examiner* — Zachary Pape
(74) *Attorney, Agent, or Firm* — Schwabe, Williamson & Wyatt, P.C.

(57) ABSTRACT

Embodiments described herein may include apparatuses, systems and/or processes to encapsulate a circuit board to be cooled with a liquid coolant, that includes a first part dimensioned to receive the circuit board coupled with one or more heat sinks; a second part dimensioned to mate with the first part, and with a portion of a side of the circuit board around the one or more heat sinks to create a volume surrounding the circuit board, with a portion of the one or more heat sinks are outside the volume and is to be exposed to the liquid coolant, and a sealer to seal areas where the second part mates with the first part and the portion of the side of the circuit board, to prevent the liquid coolant from entering the volume. Other embodiments may be described and/or claimed.

14 Claims, 6 Drawing Sheets

SYSTEM TO REDUCE COOLANT USE IN AN ARRAY OF CIRCUIT BOARDS

FIELD

Embodiments of the present disclosure generally relate to the fields of computing and electronic systems and thermal management. More specifically, embodiments of the present disclosure relate to liquid cooling of components in a computing or electronic system.

BACKGROUND

As components of computing or electronic systems decrease in size and increase in power requirements as well as thermal dissipation, cooling individual components as well as collections of components will become increasingly important to ensure proper system function moving forward. For example, the size of central processing unit (CPU) dies are miniaturizing at the same time the number of cores, heat dissipation, and thermal design power (TDP) of these dies are increasing. This can result in a higher heat flux from the CPU dies and increase the challenge for thermally managing the CPU as well as other components that may be on the same motherboard or other printed circuit board (PCB), as the CPU.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments described herein may include apparatuses, systems and/or processes for displacing coolant fluid around components on a motherboard or other PCB where the coolant fluid may not be required, and routing coolant to thermally significant components for exposure to the coolant fluid. Embodiments may include a sealed enclosure to prevent coolant fluid from coming into contact with those components or with space around those components. Embodiments may include inserting displacement material positioned in proximity to components to displace the coolant fluid or to route the coolant fluid to other thermally significant components for thermal transfer with the fluid. As a result of implementing these embodiments, a lower overall volume of coolant fluid may be used for adequate cooling.

In legacy immersion cooling implementations, an entire CPU, motherboard, or system may be submerged into a cooling tank that holds coolant fluid. In some cases, an entire rack unit, for example a 2U unit, that would otherwise be air cooled may be inserted into the cooling tank. Such a rack unit designed for air cooling may fill a bigger volume for dissipating heat through airflow then may be needed for dissipating heat through coolant fluid flow.

In one example, data center environments may have a specified maximum floor loading criteria for servers. Due to the large increase in weight when using an immersion style tank and the required amount of fluid for cooling, frequently only a single level design may be used to house servers without making significant and costly upgrades to the floor infrastructure. These legacy implementations may reduce immersion cooling efficiency in a data center environment from a space utilization perspective. For example, a room designed to be filled with 42U height cabinets may only be able to use a quarter of that height due to the weight of the coolant fluid.

In embodiments described herein, PCBs within enclosures may be immersed into cooling server systems, for example within submersion tanks, where coolant fluid may still be exposed to thermally significant components of the PCB. However, coolant fluid may be displaced from areas on the PCBs were cooling is not required. Thus, these embodiments may significantly reduce the weight of and amount of coolant fluid needed for immersion tank cooling implementation.

Coolant fluids used in immersion cooling systems may range from engineered dual and single phase fluids, to simple mineral oil based systems. The cost of using a specialized single or dual phase fluids may be very expensive, for example up to $750/gallon or beyond. These fluids may also be very heavy, for example some may approach twice the density of water.

For larger data centers that implement immersion cooling, particularly for high-performance PCBs, supporting excess weight of immersion cooling tanks may increase construction and maintenance costs of the data center. Reducing the amount of coolant fluid used may reduce cost, weight, operation risk, and total cost of ownership for the data center. In addition, because higher performance immersion coolant fluids are typically Perfluorocarbon based, a reduction in coolant fluid use may significantly reduce the resulting environmental impact of using the coolant fluid.

Embodiments may also include a rack server architecture and/or chassis that may include a plurality of PCB while coolant fluid is applied to cool components coupled with the plurality of the PCBs. In embodiments, the placement of the PCBs, along with the sealing mechanisms or fluid displacement material that may surround the PCBs, may facilitate coolant fluid flowing in a particular direction. Embodiments may allow for cooling a higher density of PCBs with a significantly reduced weight as compared to a legacy cooling tank implementations. Implementations may also allow for an increased number of servers (e.g. motherboards or other PCBs) per data center square foot by allowing significantly taller racks that use liquid cooling structures that may be vertically scaled or may be in multi-level configurations. These embodiments may enable data center infrastructure to be support a larger number of servers that may be operated at a greater power as compared with legacy immersion cooled systems.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical, thermal or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements or devices are thermally coupled. By way of example and not limitation, "coupled" may mean two or more elements/devices cooperate and/or interact. By way of example and not limitation, a computing apparatus may include two or more computing devices "coupled" on a motherboard or by one or more network linkages.

The term "around" may mean located or situated on every side of an object or on every side of a portion of an object. A substance that is "around" an object may be proximate to the object or may come into physical or thermal contact with the object.

Figure 1:
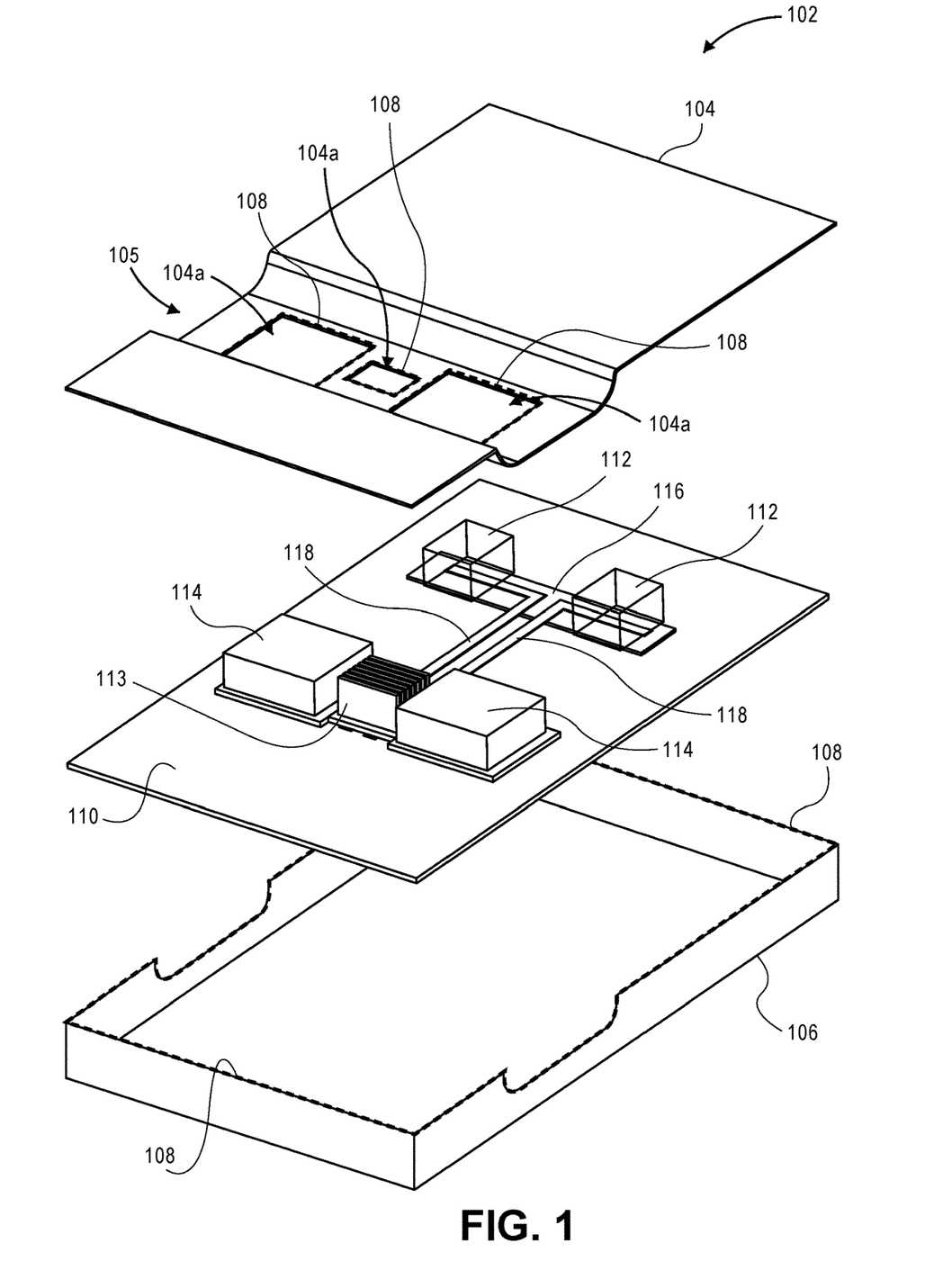
FIG. 1 is an exploded view of a sealed enclosure mechanism to surround at least some components on a PCB to exclude immersion coolant, in accordance with various embodiments.

FIG. 1 is an exploded view of a sealed enclosure mechanism to surround at least some components on a PCB to exclude immersion coolant, in accordance with various embodiments. Diagram 102 shows an exploded view of a sealed enclosure that may include a top portion 104 and a bottom portion 106. In embodiments, the top portion 104 and bottom portion 106 may be attached at seal 108. In embodiments, the seal 108 may form a watertight seal. In embodiments, the seal may be an epoxy, resin, rubber, silicone, or some other compound to form a barrier to prevent coolant fluid from entering the enclosure 102. In embodiments, top portion 104 may be referred to as a "first part" of an encapsulation apparatus, enclosure, or the like and the bottom portion 106 may be referred to as a "second part" of an encapsulation, enclosure, or the like. In embodiments, top portion 104 may be referred to as a "second part" of an encapsulation apparatus, enclosure, or the like and the bottom portion 106 may be referred to as a "first part" of an encapsulation apparatus, enclosure, or the like.

In embodiments, a PCB 110 may be positioned within the sealed enclosure 102. The PCB 110 may include various heat generating components 112, such as processors, memory, voltage regulators, and the like, that may be thermally coupled to one or more heat sinks 114. In embodiments, the heat sinks 114 may include fins or other shapes to facilitate heat transfer from the heat sinks 114 to outside of the sealed enclosure 102. In embodiments, the heat generating components 112 may be thermally coupled to heat sinks 114 by heat spreaders 116 or heat pipes 118. Other thermal transfer mechanisms (not shown) may be used to couple the heat generating components 112 to the heat sinks 114. In embodiments, the heat sinks 114 may be attached to and/or part of the sealed enclosure 102 (not shown) and may be thermally coupled to heat generating components 112 on the PCB 110.

In embodiments, the top portion 104 may include cutouts 104a that may allow the various heat sinks 114 or heat generating components 113 coupled with the PCB 110 to extend outside of the sealed enclosure 102. In embodiments, the exposed heat sinks 114 or the exposed heat generating components 113 may come into contact with coolant fluid, such as coolant fluid 220 of FIG. 2, that may surround all or part of the sealed enclosure 102 and that may be used to transfer heat from the PCB 110. In embodiments, the cutouts 104a may include one or more watertight seal 108 to the PCB 110 to prevent any coolant fluid 220 from reaching other portions of the PCB 110 or the components 112 that may be contained within the sealed enclosure 102. Because the coolant fluid 220 is excluded from the sealed enclosure 102, less coolant fluid 220 may be required to adequately cool the PCB 110.

Figure 2:
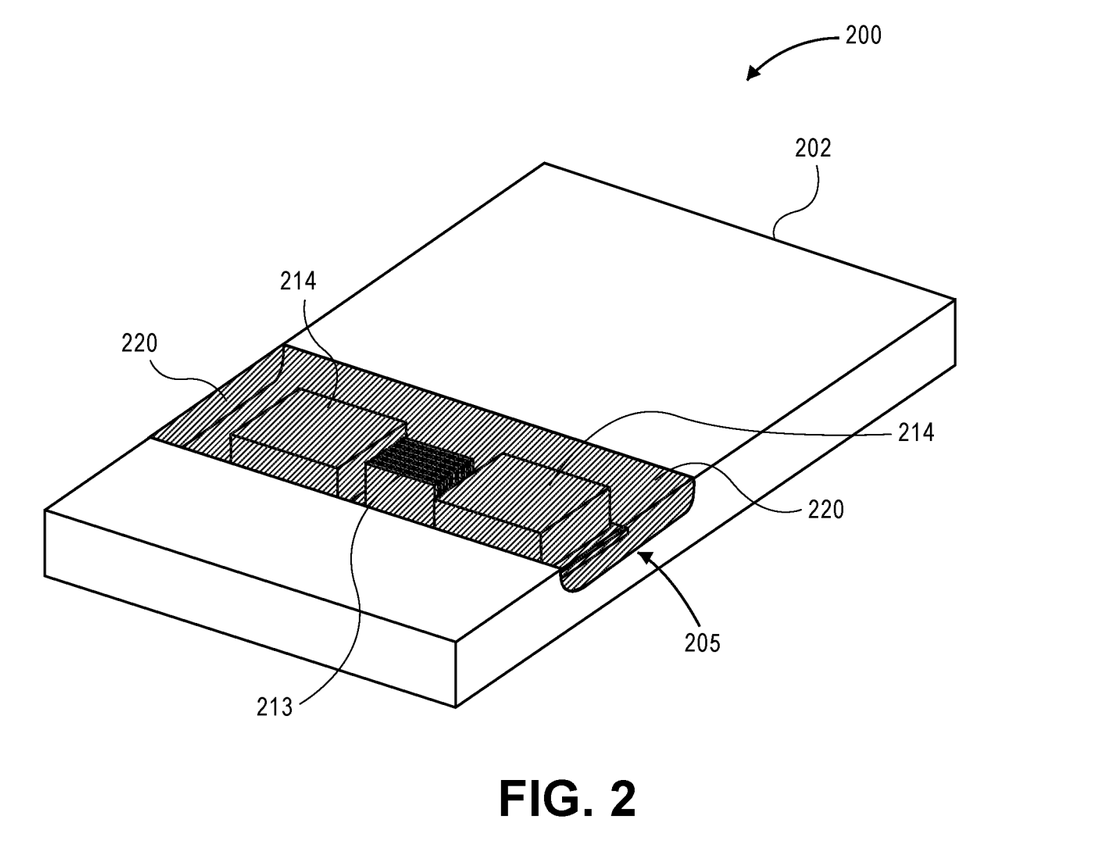
FIG. 2 illustrates an assembled sealing mechanism surrounding components on a PCB interacting with a coolant fluid, in accordance with various embodiments.

In embodiments, the top portion 104 may include a trench 105 to allow part of the top portion 104 to couple with the PCB 110. The trench 105 may also facilitate the flow of coolant fluid 220 outside of the sealed enclosure 102 to come into contact with the heat sinks 114 or heat generating components 113 as shown in FIG. 2. In embodiments, the top portion 104 or the bottom portion 106, in addition to or instead of accommodating trench 105, may have other indentations, raised portions, channels, or other features (not shown) to accommodate the topology of either side of the PCB 110 or components thereon. The indentations, raised portions, channels, or other features (not shown) may also facilitate the flow of coolant fluid 220 past the heat sinks 114 or heat generating components 113 that may emerge from the sealed enclosure 102. In embodiments, the heat sinks 114 or heat generating components 113 may protrude from other places in the sealed enclosure 102 to access the coolant fluid 220.

In embodiments, watertight seals 108 may prevent the coolant fluid 220 from entering into the sealed enclosure 102 and coming into contact with portions of the PCB 110. In embodiments, watertight seals 108 may be made of a gasket material, for example when the sealed enclosure 102 is to be submerged in a cooling tank. In embodiments, the top portion 104 and the bottom portion 106 of the sealed enclosure 102 may include one or more fasteners (not shown) or fastener patterns (not shown) that may be used to couple the top portion 104 and the bottom portion 106 and provide load to the gasket to prevent coolant fluid from entering the sealed enclosure 102.

Although the sealed enclosure 102 is shown substantially as a box having a top portion 104 and a bottom portion 106, in other embodiments the sealed enclosure 102 may have any number of sides, or may be of any other shape that may seal part or all of the PCB 110 from access by the coolant fluid 220. In other embodiments, the sealed enclosure may not have a special shape that includes trenches 105 or other indentations (not shown), but rather the heat sinks 114 or heat generating components 113 may stick directly out of sealed enclosure 102 to come into contact with the coolant fluid 220. In embodiments, additional structures (not shown) may be included within the sealed enclosure 102 to facilitate the enclosure retaining it shape when immersed in a tank (not shown) of coolant fluid 220.

In embodiments, the sealed enclosure 102 may isolate an air volume around a portion of the PCB 110 to which coolant fluid 220 does not need to come into contact for cooling. Only the surfaces of the PCB 110, or associated components such as heat sinks 114 or heat generating components 113 are exposed that may need to come into contact with coolant fluid 220 for thermal transfer. Implementation may reduce not only the volume of coolant fluid 220 needed to cool the PCB 110, but may also reduce the length of the path in which the coolant fluid 220 may need to flow to cool the PCB 110.

FIG. 2 illustrates an assembled sealing mechanism surrounding components on a PCB interacting with a coolant fluid, in accordance with various embodiments. Diagram 200 may show an assembled sealed enclosure 202, which may be similar to the sealed enclosure 102 of FIG. 1. As shown, the heat sinks 214 and heat generating components 213 are exposed outside of the sealed enclosure 202 and positioned in the trench 205, which may be similar to trench 105 of FIG. 1. The trench 205 may contain coolant fluid 220, thus immersing heat sinks 214 and heat generating components 213 in coolant fluid 220. In embodiments, the coolant fluid 220 may flow in a particular direction, thereby facilitating thermal transfer from the heat sinks 214 and heat generating components 213 to the coolant fluid 220.

Figure 3:
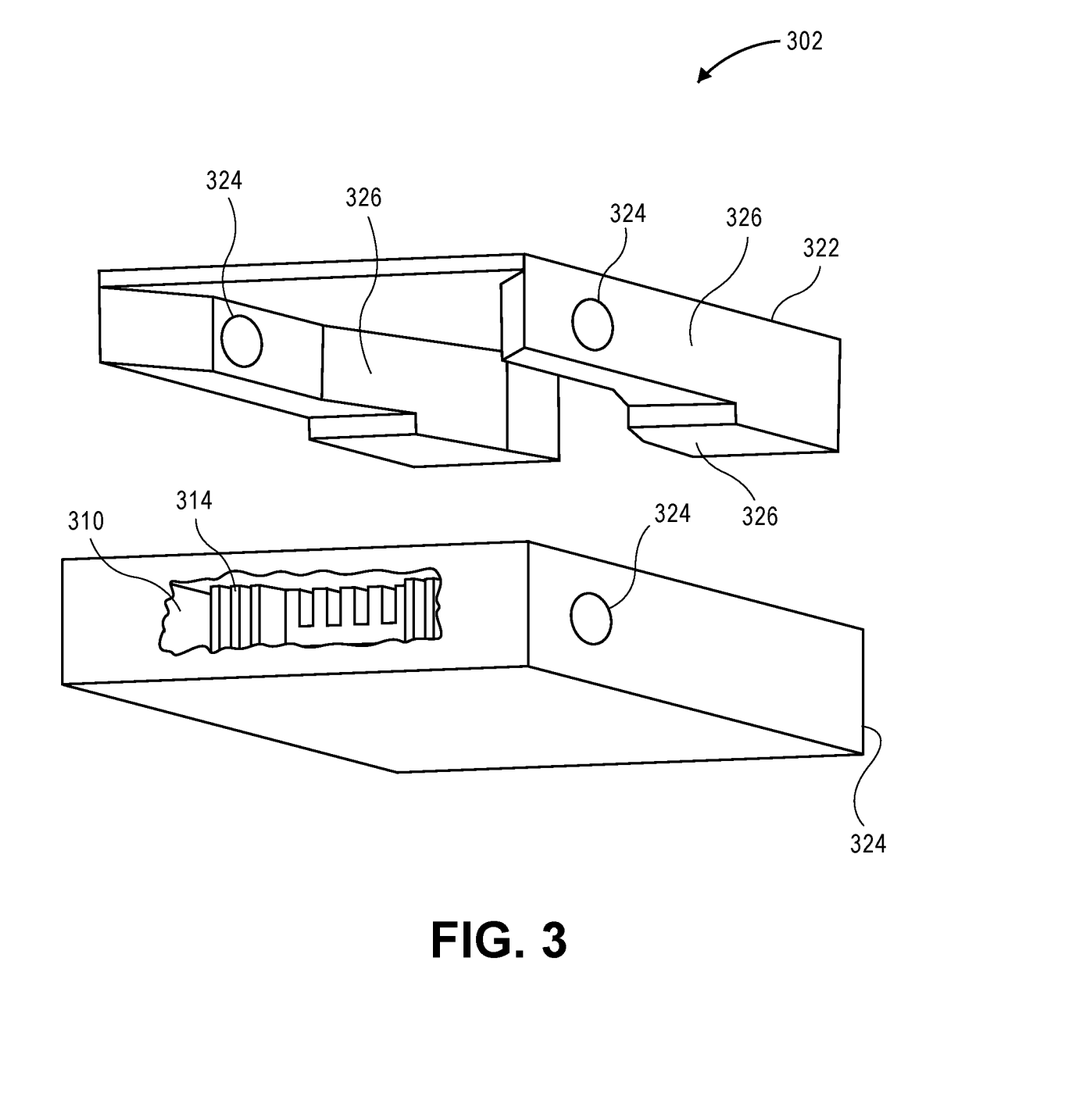
FIG. 3 is an exploded view of fluid displacement material positioned in proximity to components on a PCB to displace immersion coolant in proximity to the components, in accordance with various embodiments.

FIG. 3 is an exploded view of fluid displacement material positioned in proximity to components on a PCB to displace immersion coolant in proximity to the components, in accordance with various embodiments. Diagram 302 shows an enclosure that may include a top portion 322 and a bottom portion 324 that may enclose or partially enclose a PCB 310, that may be similar to PCB 110 of FIG. 1. Heat sinks 314, which may be similar to heat sinks 114 of FIG. 1, in addition to other heat generating components may be coupled to PCB 310.

In embodiments, the top portion 322 may include displacement material 326 coupled to one side. The displacement material 326 may be dimensioned to restrict or to cut off coolant fluid access, or to allow or facilitate coolant fluid access, to various areas of the PCB 310 when the top portion 322 and the bottom portion 324 are secured. In embodiments, the displacement material 326 may form shapes within the enclosure 302 that may facilitate the flow of immersion coolant across the PCB 310 as well as attached components, such as components 112, 113 or heat sinks 114 of FIG. 1. In embodiments, displacement material 326 may be coupled to the bottom portion 324, or may be placed in a free-form fashion within the enclosure 302 during its assembly. In embodiments, the displacement material 326 may be made out of foam or other material, or may be one or more water-tight shapes that may form a sealed volume to displace coolant fluid 220. In embodiments, the fluid displacement material 326 may be partially fluid absorbent or may be non-fluid absorbent.

In embodiments, either the top portion 322 or the bottom portion 324 may include sides and/or fastening mechanisms (not shown) to secure the enclosure 302 after assembly. Openings 324, when the enclosure 302 is assembled, may facilitate coolant fluid 220 flowing into and out of the enclosure 302. The displacement material 326 may be positioned to route coolant flow to areas of the PCB 310 to dissipate heat. In embodiments, one or more portions of the PCB 310 may be within a sealed enclosure (not shown) to prevent coolant fluid 220 from reaching those portions, for example to prevent various components on the PCB 310 from coming in contact with coolant fluid 220. This may allow coolant fluid 220 to be used that may be corrosive to certain materials used on the PCB 310.

In embodiments, top portion 322 may be referred to as a "first part" of an encapsulation apparatus, enclosure, or the like and the bottom portion 324 may be referred to as a "second part" of an encapsulation apparatus, enclosure, or the like. In embodiments, top portion 322 may be referred to as a "second part" of an encapsulation apparatus, enclosure, or the like and the bottom portion 324 may be referred to as a "first part" of an encapsulation apparatus, enclosure, or the like.

Figure 4:
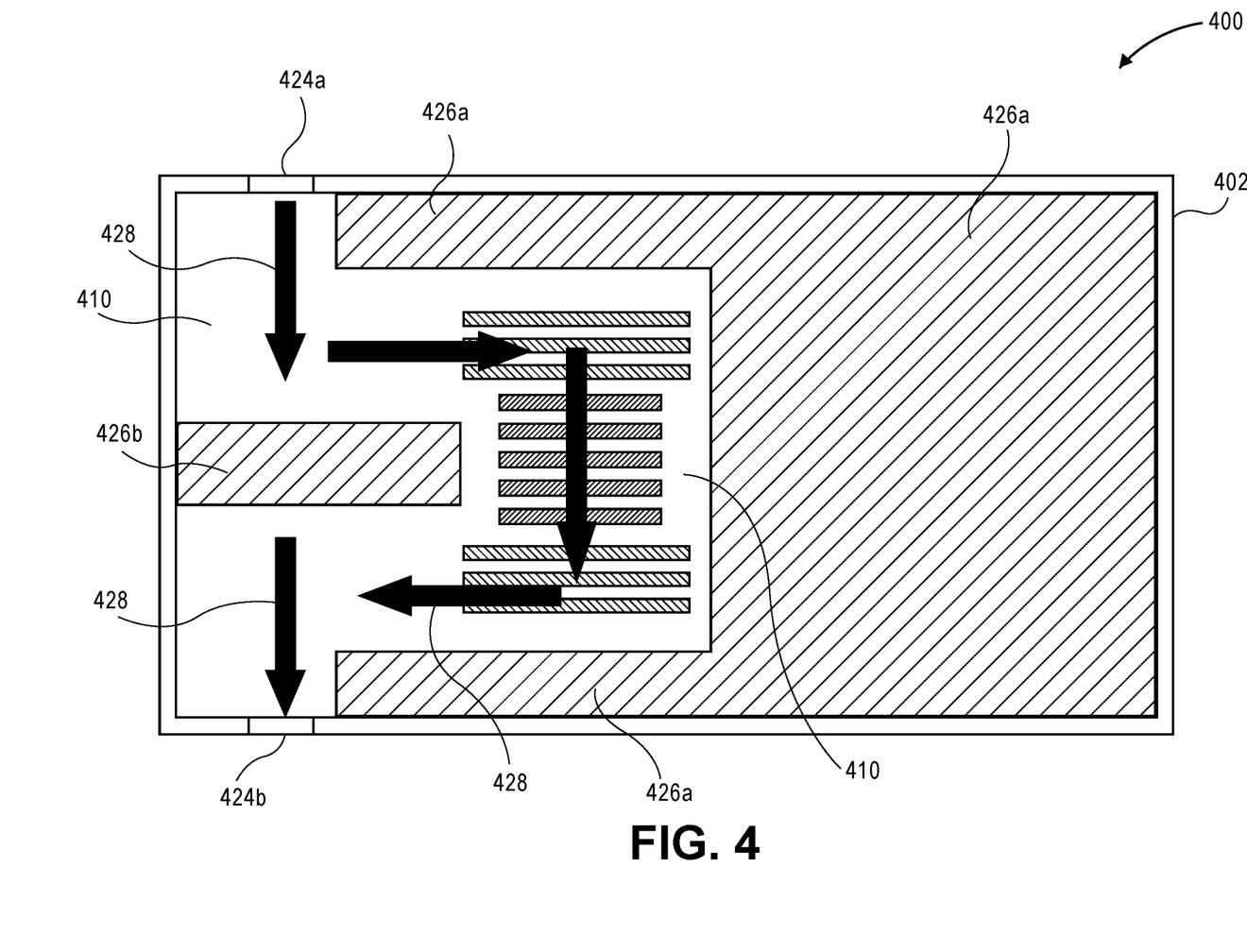
FIG. 4 illustrates coolant flow around a PCB with fluid displacement material positioned in proximity to the PCB, in accordance with various embodiments.

FIG. 4 illustrates coolant flow around a PCB with fluid displacement material positioned in proximity to the PCB, in accordance with various embodiments. Diagram 400 shows a cutaway view of an enclosure 402 and a PCB 410, which may be respectively similar to enclosure 320 and PCB 310 of FIG. 3. The enclosure 420 may include openings 424a, 424b, which may be similar to openings 324 of FIG. 3, to facilitate coolant fluid flow 428 over and around portions of the PCB 410. In embodiments, the coolant fluid flow 428 may be the result of an external pump (not shown), coolant fluid convection, gravity, or some other suitable means.

In embodiments, the displacement material 426a, 426b, which may be similar to fluid displacement material 326 of FIG. 3, may be positioned to facilitate the coolant fluid flow 428 throughout the enclosure 402. For example, displacement material 426a may extend substantially to the PCB 410, and prevent or reduce the amount of coolant fluid, such as coolant fluid 220 of FIG. 2, reaching the area on the PCB 410 proximate to the displacement material 426a. In embodiments, the displacement material 426a may also surround and/or encapsulate components (not shown) on the PCB 410 to prevent or substantially prevent coolant fluid flow 428 to those components.

In embodiments, displacement material 426b may be used as a baffle or some other structure to direct the coolant fluid flow 428 in specific areas within the enclosure 402. In embodiments, displacement material 426 may be of any suitable shape, or may be able to move or adjust position before, during, or after coolant fluid flow 428 to modify thermal transfer characteristics with respect to PCB 410.

Figure 5:
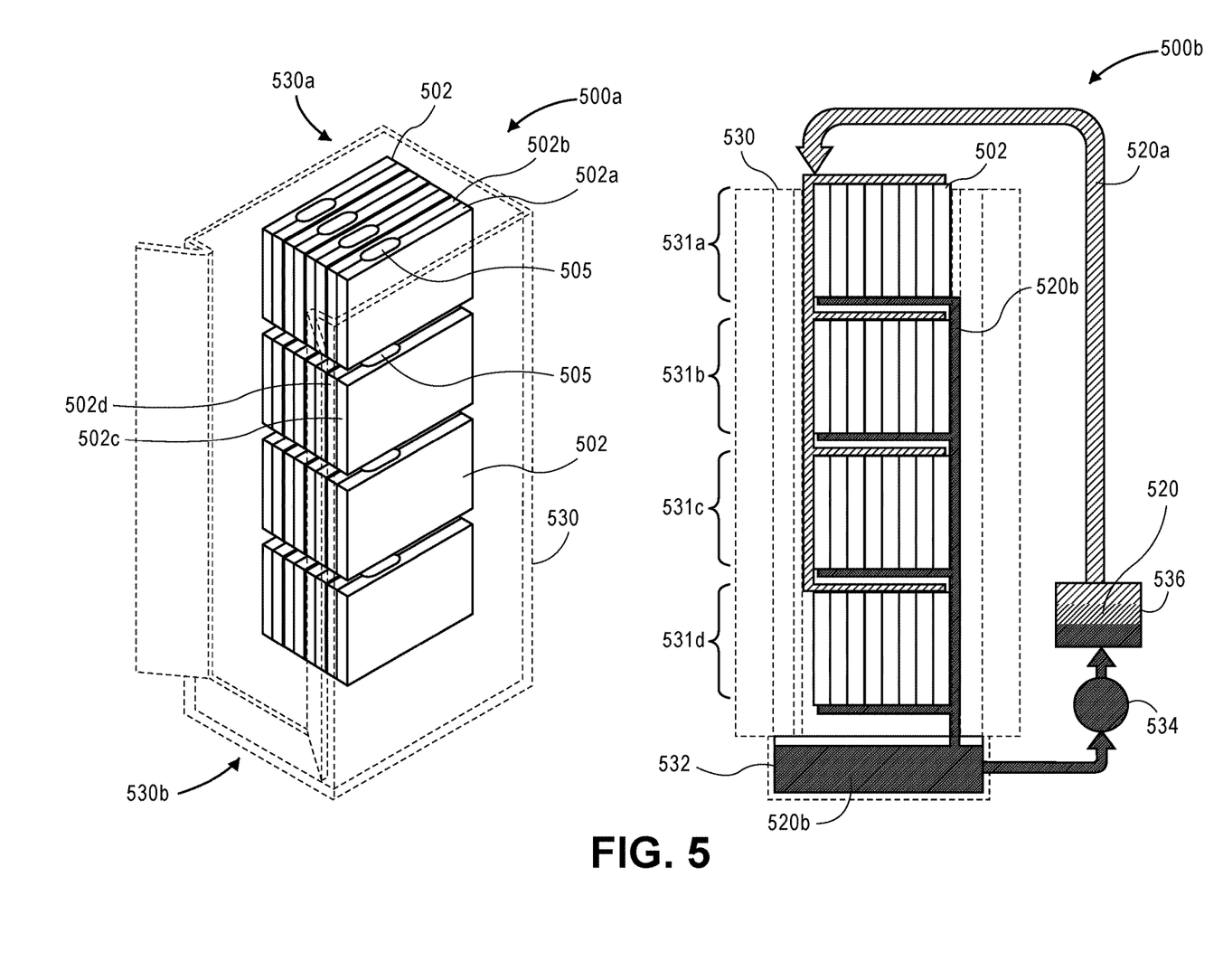
FIG. 5 illustrates a liquid cooling system for a plurality of PCBs, in accordance with various embodiments.

FIG. 5 illustrates a liquid cooling system for a plurality of PCBs, in accordance with various embodiments. Diagram 500a shows a three-dimensional example of a plurality of enclosures 502, which may be similar to the sealed enclosures 102 of FIG. 1 or the enclosures 302 of FIG. 3. In this example, adjacent enclosures 502 may be positioned so that a channel 505, may be formed based on alignment of trench(es) 105 of FIG. 1, through which coolant fluid, which may be similar to coolant fluid 120 of FIG. 1 may flow. In embodiments, a first set of horizontally positioned sealed enclosures 502a, 502b may be positioned so that their respective trenches 105 may join and form a channel 505. A second set of horizontally positioned sealed enclosures 502c, 502d may be positioned below the first set of horizontally positioned sealed enclosures 502a, 502b, so that their respective channels 505 may connect. Coolant fluid 520 may then flow from the first set of horizontally positioned sealed enclosures 502a, 502b through the second set of horizontally positioned sealed enclosures 502c, 502d to dissipate heat from PCBs, such as PCB 110 of FIG. 1, respectively within the sealed enclosures 502a-502d.

In embodiments, the sealed enclosures 502a-502d may be implemented as enclosures 402 of FIG. 4, and may be aligned such that coolant fluid 520 may flow into opening 424a and out of opening 424b to expose PCB 410 to the coolant fluid 520. In addition, it is to be appreciated that there may be a wide variety of different designs for enclosures 502 such that, when placed together, may form various channels and/or paths through which coolant fluid 520 may flow to dissipate heat from PCB 410. In implementations, because each sealed enclosure 502 may not be immersed in a coolant tub and instead may be cooled by a steady flow of coolant 520 flowing around each enclosure 402, PCBs may be more tightly packed together. This may result in the overall weight of the coolant fluid 520 used being substantially less than would be used with legacy immersion techniques.

In embodiments, the arrangement of the sealed enclosures 502 may be placed within a containment structure 530, where coolant fluid 520 may enter near containment structure top 530a, flow past and dissipate heat from enclosures 502, and flow to the bottom of the containment structure 530b. In embodiments, the containment structure 530 may provide one or more watertight panels and/or access ways to accommodate any coolant fluid 520 leaks and to route such coolant fluid 520 to the bottom of the containment structure 530b.

Diagram 500b shows another embodiment of circulating coolant fluid 520 through a plurality of enclosures 502. Coolant fluid 520 may be pumped from a fluid reservoir 532 by a pump 534 through a heat exchanger 536. The heat exchanger 536 may dissipate heat and cool the coolant fluid 520 through ambient air or through some other thermal energy transfer process. Although the reservoir 532, pump 534, and heat exchanger 536 are shown next to the containment structure 530, in embodiments they may be placed in any suitable location.

The cooled coolant fluid 520a may be pumped to the top of the containment structure 530a, and may then flow through past and dissipate heat from components exposed within the respective channels 505 of enclosures 502. In embodiments, the cooled coolant fluid 520a may be pumped to the top of sections 531a-531d within the containment structure 530. The warmed coolant 520b may then flow respectively from each of the sections 531a-531d to the fluid reservoir 532.

In embodiments, the containment structure 530 that includes the plurality of sealed enclosures 502 may allow for a taller containment structure 530 and a denser packing of plurality of sealed enclosures 502 that may otherwise be implemented with the plurality of sealed enclosures 502 placed in immersion tank. Embodiment implementations may include containment structures 530 in the form of a standard 42U style cabinet that may be fully scalable in both width and height, where the full data center height may be used. Thus, getting the advantages of liquid cooling while avoiding the disadvantages of increased weight of immersion systems.

In addition, the vertical implementation shown in diagrams 500a, 500b may use existing off-the-shelf rack server architecture and incorporate one or more manifolds not shown to provide cooled coolant fluid 520a to each rack server.

Figure 6:
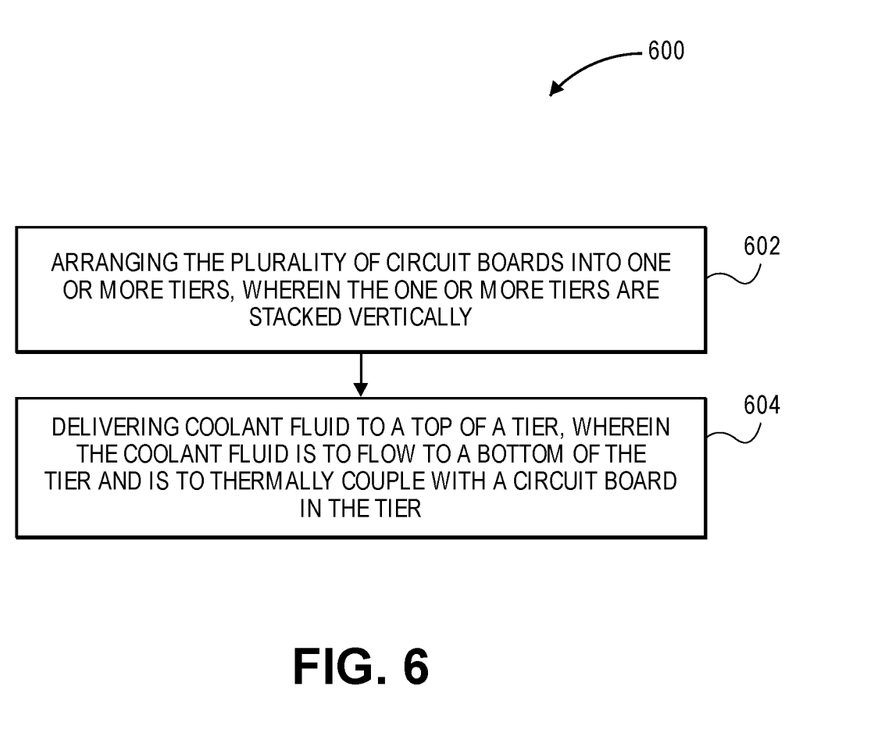
FIG. 6 is a block diagram of a process for sealing a portion of a PCB in the mechanism of FIG. 1, in accordance with various embodiments.

FIG. 6 is a block diagram of a process for providing thermal cooling to a plurality of circuit boards, in accordance with various embodiments. The process shown in diagram 600 may be implemented using the techniques and components described in FIGS. 1-5.

At block 602, the process may include arranging the plurality of circuit boards into one or more tiers, wherein the one or more tiers are stacked vertically. In embodiments, the circuit boards, such as PCB 110, 310 of FIGS. 1, 3 may be partially or fully contained within enclosures such as sealed enclosure 102 of FIG. 1, or enclosure 302 of FIG. 3. The enclosed circuit boards may then be placed in tiers, such as sections 531a-531d of FIG. 5.

At block 604, the process may include delivering coolant fluid to a top of a tier, wherein the coolant fluid is to flow to a bottom of the tier and is to thermally couple with a circuit board in the tier. In embodiments, the enclosed circuit boards within a tier may be positioned such that channels or other features of the enclosure may route cooling fluid, such as coolant fluid 520, down the enclosure and to dissipate heat from the circuit boards. In other embodiments, the enclosed circuit boards within a tier may be positioned such that coolant fluid 520 may flow into a first opening of an enclosure, such as an enclosure 302 of FIG. 3, around the circuit board, and out a second opening of the enclosure. In embodiments, the coolant fluid 520 may be dispersed at the top of the enclosure either directly, or through a manifold system. In embodiments, the coolant fluid 520 may flow through the enclosures primarily through gravity. The coolant fluid 520 may be pumped by a pump 534 from a reservoir 532 at the bottom of the tiers, through a heat exchanger 536, where the cooled coolant fluid 520a may flow back to the top tier 531a.

Various operations are described as multiple discrete operations in turn, in a manner that is most helpful in understanding the claimed subject matter. However, the order of description should not be construed as to imply that these operations are necessarily order dependent.

EXAMPLES

Example 1 may be an apparatus to encapsulate a circuit board to be cooled with a liquid coolant, comprising: a first part dimensioned to receive the circuit board coupled with one or more heat sinks; a second part dimensioned to mate with the first part, and with a portion of a side of the circuit board around the one or more heat sinks to create a volume surrounding the circuit board, wherein a portion of the one or more heat sinks are outside the volume and is to be exposed to the liquid coolant; and a sealer to seal areas where the second part mates with the first part and the portion of the side of the circuit board, to prevent the liquid coolant from entering the volume.

Example 2 may include the apparatus of example 1, wherein the first part and the second part include a rigid material to cause the first part and the second part to substantially retain its shape when submerged in the liquid coolant.

Example 3 may include the apparatus of example 1, wherein the first part and the second part, when mated together, substantially form a rectangular prism.

Example 4 may include the apparatus of example 1, wherein the first part and the second part are dimensioned to include a channel formed in the second part from a first side of the second part to a second side of the second part opposite the first side to accommodate a flow of the liquid coolant through the channel, and wherein the one or more heat sinks are at least partially within the channel.

Example 5 may include the apparatus of example 1, wherein the one or more heat sinks comprise multiple heat sinks.

Example 6 may include the apparatus of example 1, wherein the circuit board is coupled to the one or more heat sinks via one or more heat pipes.

Example 7 may include the apparatus of example 1, wherein the sealer comprises an epoxy or a gasket.

Example 8 may be a system to reduce coolant use, comprising: a plurality of apparatuses to encapsulate a circuit board to be cooled with a liquid coolant, each comprising: a first part dimensioned to receive the circuit board coupled with one or more heat sinks; a second part dimensioned to mate with the first part, and with a portion of a side of the circuit board around the one or more heat sinks to create a volume surrounding the circuit board, wherein a portion of the one or more heat sinks are outside the volume and is to be exposed to the liquid coolant; and a sealer to seal areas where the second part mates with the first part and the portion of the side of the circuit board, to prevent the liquid coolant from entering the volume; and wherein a first apparatus and a second apparatus are coupled to allow the liquid coolant to contact the first apparatus and the second apparatus.

Example 9 may include the system of example 8, wherein the first part and the second part include a rigid material to cause the first part and the second part to substantially retain its shape when submerged in the liquid coolant.

Example 10 may include the system of example 8, wherein the first part and the second part, when mated together, substantially form a rectangular prism.

Example 11 may include the system of example 8, wherein the first part and the second part are dimensioned to include a channel formed in the second part from a first side of the second part to a second side of the second part opposite the first side to accommodate a flow of the liquid coolant through the channel, and wherein the one or more heat sinks are at least partially within the channel.

Example 12 may include the system of example 11, wherein the first apparatus and the second apparatus are coupled further includes wherein the channel of the first apparatus is connected to the channel of the second apparatus to allow the liquid coolant to flow past the heat sink in the channel of the first apparatus to the heatsink in the channel of the second apparatus.

Example 13 may include the system of example 11, wherein the first apparatus and the second apparatus are coupled further includes wherein the channel of the first apparatus and the channel of the second apparatus form a pipe in which the liquid coolant is to flow, and wherein the coolant is to flow past the one or more heat sinks in the channel of the first mechanism and the one or more heatsinks in the channel of the second mechanism.

Example 14 may include the system of example 1, wherein the plurality of apparatuses are located in a cabinet.

Example 15 may be a method for cooling a plurality of circuit boards, comprising: arranging the plurality of circuit boards into one or more tiers, where in the one or more tiers are stacked vertically; and delivering liquid coolant to a top of a tier, wherein the liquid coolant is to flow to a bottom of the tier and is to thermally couple with a circuit board in the tier.

Example 16 may include the method of example 15, wherein the tier is a first tier; and further comprising delivering liquid coolant from the bottom of the first tier to a top of a second tier, wherein the liquid coolant at the top of the second tier is to flow to a bottom of the second tier and is to thermally couple with a circuit board in the second tier.

Example 17 may include the method of example 15, further comprising chilling the liquid coolant at the bottom of the tier.

Example 18 may include the method of example 17, wherein chilling the liquid coolant further includes passing the liquid coolant through a heat exchanger.

Example 19 may include the method of example 15, wherein delivering liquid coolant further includes pumping the liquid coolant to the top of the tier.

Example 20 may include the method of example 15, wherein delivering liquid coolant further includes delivering liquid coolant from a bottom of a higher tier.

Example 21 may include the method of example 15, wherein the plurality of circuit boards are in a cabinet.

Example 22 may be an apparatus for cooling a plurality of circuit boards, comprising: means for arranging the plurality of circuit boards into one or more tiers, where in the one or more tiers are stacked vertically; and means for delivering liquid coolant to a top of a tier, wherein the liquid coolant is to flow to a bottom of the tier and is to thermally couple with a circuit board in the tier.

Example 23 may include the apparatus of example 22, wherein the tier is a first tier; and further comprising means for delivering liquid coolant from the bottom of the first tier to a top of a second tier, wherein the liquid coolant at the top of the second tier is to flow to a bottom of the second tier and is to thermally couple with a circuit board in the second tier.

Example 24 may include the apparatus of example 22, further comprising means for chilling the liquid coolant at the bottom of the tier.

Example 25 may include the method of example 22, wherein means for delivering liquid coolant further includes means for pumping the liquid coolant to the top of the tier.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. An apparatus to encapsulate a circuit board to be cooled with a liquid coolant, comprising:
   a first part dimensioned to receive the circuit board coupled with one or more heat sinks;
   a second part dimensioned to mate with the first part, and with a portion of a side of the circuit board around the one or more heat sinks to create a volume surrounding the circuit board, wherein a portion of the one or more heat sinks are outside the volume and is to be exposed to the liquid coolant; and
   a sealer to seal areas where the second part mates with the first part and the portion of the side of the circuit board, to prevent the liquid coolant from entering the volume.

2. The apparatus of claim 1, wherein the first part and the second part include a rigid material to cause the first part and the second part to substantially retain its shape when submerged in the liquid coolant.

3. The apparatus of claim 1, wherein the first part and the second part, when mated together, substantially form a rectangular prism.

4. The apparatus of claim 1, wherein the first part and the second part are dimensioned to include a channel formed in the second part from a first side of the second part to a second side of the second part opposite the first side to accommodate a flow of the liquid coolant through the channel, and
   wherein the one or more heat sinks are at least partially within the channel.

5. The apparatus of claim 1, wherein the one or more heat sinks comprise multiple heat sinks.

6. The apparatus of claim 1, wherein the circuit board is coupled to the one or more heat sinks via one or more heat pipes.

7. The apparatus of claim 1, wherein the sealer comprises an epoxy or a gasket.

8. A system to reduce coolant use, comprising:
   a plurality of apparatuses to encapsulate a circuit board to be cooled with a liquid coolant, each comprising:
   a first part dimensioned to receive the circuit board coupled with one or more heat sinks;
   a second part dimensioned to mate with the first part, and with a portion of a side of the circuit board around the one or more heat sinks to create a volume surrounding the circuit board, wherein a portion of the one or more heat sinks are outside the volume and is to be exposed to the liquid coolant; and
   a sealer to seal areas where the second part mates with the first part and the portion of the side of the circuit board, to prevent the liquid coolant from entering the volume; and
   wherein a first apparatus and a second apparatus are coupled to allow the liquid coolant to contact the first apparatus and the second apparatus.

9. The system of claim 8, wherein the first part and the second part include a rigid material to cause the first part and the second part to substantially retain its shape when submerged in the liquid coolant.

10. The system of claim 8, wherein the first part and the second part, when mated together, substantially form a rectangular prism.

11. The system of claim 8, wherein the first part and the second part are dimensioned to include a channel formed in the second part from a first side of the second part to a second side of the second part opposite the first side to accommodate a flow of the liquid coolant through the channel, and
   wherein the one or more heat sinks are at least partially within the channel.

12. The system of claim 11, wherein the first apparatus and the second apparatus are coupled further includes wherein the channel of the first apparatus is connected to the channel of the second apparatus to allow the liquid coolant to flow past the heat sink in the channel of the first apparatus to the heatsink in the channel of the second apparatus.

13. The system of claim 11, wherein the first apparatus and the second apparatus are coupled further includes wherein the channel of the first apparatus and the channel of the second apparatus form a pipe in which the liquid coolant is to flow, and wherein the coolant is to flow past the one or more heat sinks in the channel of the first apparatus and the one or more heatsinks in the channel of the second apparatus.

14. The system of claim 1, wherein the plurality of apparatuses are located in a cabinet.

* * * * *